United States Patent
Miyamoto

(10) Patent No.: US 9,201,307 B2
(45) Date of Patent: Dec. 1, 2015

(54) DEVELOPING SOLUTION COMPOSITION FOR LITHOGRAPHIC PRINTING PLATE PRECURSOR AND METHOD FOR PRODUCING LITHOGRAPHIC PRINTING PLATE

(71) Applicant: Yasushi Miyamoto, Rochester, NY (US)

(72) Inventor: Yasushi Miyamoto, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

(21) Appl. No.: 14/400,894

(22) PCT Filed: Jun. 27, 2013

(86) PCT No.: PCT/JP2013/067696
§ 371 (c)(1),
(2) Date: Nov. 13, 2014

(87) PCT Pub. No.: WO2014/003134
PCT Pub. Date: Jan. 3, 2014

(65) Prior Publication Data
US 2015/0125795 A1    May 7, 2015

(30) Foreign Application Priority Data
Jun. 29, 2012    (JP) .................................. 2012-147310

(51) Int. Cl.
| | | |
|---|---|---|
| G03F 7/00 | (2006.01) |
| G03F 7/32 | (2006.01) |
| G03F 7/004 | (2006.01) |
| G03F 7/039 | (2006.01) |
| B41C 1/10 | (2006.01) |

(52) U.S. Cl.
CPC . *G03F 7/327* (2013.01); *B41C 1/10* (2013.01); *G03F 7/00* (2013.01); *G03F 7/004* (2013.01); *G03F 7/039* (2013.01); *G03F 7/32* (2013.01); *G03F 7/322* (2013.01)

(58) Field of Classification Search
CPC ........................................................ B41C 1/10
USPC .......................................................... 430/434
See application file for complete search history.

(56) References Cited

U.S. PATENT DOCUMENTS

| | | | | |
|---|---|---|---|---|
| 6,162,575 | A * | 12/2000 | Fujioka et al. ................ 430/204 |
| 2002/0058207 | A1 * | 5/2002 | Urano et al. .................. 430/302 |
| 2010/0181250 | A1 * | 7/2010 | Kim et al. ................ 210/500.38 |
| 2013/0255516 | A1 * | 10/2013 | Fujii et al. ..................... 101/453 |
| 2014/0238953 | A1 * | 8/2014 | Kojima et al. .................. 216/17 |

FOREIGN PATENT DOCUMENTS

| | | | |
|---|---|---|---|
| JP | 2000147773 A * | 5/2000 |
| JP | 2001-22077 | 1/2001 |
| WO | WO 2013076587 A2 * | 5/2013 |

* cited by examiner

*Primary Examiner* — Chanceity Robinson
(74) *Attorney, Agent, or Firm* — J. Lanny Tucker

(57) ABSTRACT

The present invention provides a novel low pH developing solution which does not contain an inorganic strong alkali component. The present invention is directed to an alkali developing solution composition for producing a lithographic printing plate, comprising: (A) an alkali agent, (B) a compound represented by the formula (I) shown below, (C) a metal salt of Group 2 elements of the Periodic Table of the Elements, and (D) a polymer comprising carboxylic acid or a salt thereof:

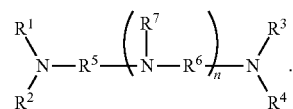

9 Claims, No Drawings

DEVELOPING SOLUTION COMPOSITION FOR LITHOGRAPHIC PRINTING PLATE PRECURSOR AND METHOD FOR PRODUCING LITHOGRAPHIC PRINTING PLATE

TECHNICAL FIELD

The present invention usually relates to a novel developing solution composition for developing a lithographic printing plate precursor. The present invention also relates to a method for preparing a lithographic printing plate using a novel developing solution composition.

BACKGROUND ART

There has hitherto been known, as a lithographic printing plate precursor, a lithographic printing plate precursor including a photosensitive image forming layer (PS plate). The PS plate basically includes two types of a negative working plate and a positive working plate. In the case of the negative working plate, a negative film is used upon exposure and then developed with a developing solution for a negative working plate. A photosensitive layer of an unexposed area is removed by this developing treatment to form a non-image area, and thus an area (exposed area) cured and insolubilized by exposure remains as an image area. In the case of the positive working plate, a positive film is used upon exposure and then developed with a developing solution for a positive working plate. A photosensitive layer of an area (exposed area) solubilized by exposure is removed to form a non-image area, and thus the unexposed area, which is not solubilized, remains as an image to form an image area.

With the progress of a computer image processing technology, there has recently been developed a method in which an image is directly written on an image forming layer by light irradiation corresponding to digital signals. An intense interest has been shown towards a CTP system in which an image is directly formed on a lithographic printing plate precursor using this method for a lithographic printing plate precursor. In a CTP plate, when the area irradiated with laser light (exposed area) is cured and becomes insoluble in an alkali developing solution to form an image area, such printing plate precursor is called a negative working plate. In contrast, when the exposed area becomes alkali-soluble and, after a developing treatment, a non-image area is formed, such printing plate precursor is called a positive working plate.

The developing solution for a positive working plate usually contains inorganic strong alkali components, for example, hydroxides, carbonates, silicates, and phosphates of alkali metals, such as sodium hydroxide, potassium hydroxide, sodium carbonate, sodium silicate, potassium silicate, sodium metasilicate, and tertiary sodium phosphate, and is a high pH aqueous solution. In contrast, the developing solution for a negative plate usually contains, as a main component, water and contains a small amount of an organic solvent, and also contains organic amines and a surfactant, although it varies depending on the composition of the image forming layer of the negative working plate. The developing solution for a negative working plate does not contain an inorganic strong alkali component and is a relatively low pH (7 to 11.5) aqueous solution.

From the viewpoint of an influence exerted on the environment, various problems have recently been pointed out regarding the use of a high pH developing solution using a strong alkali agent, thus increasing needs for a low pH developing solution using no strong alkali agent. Responding to increasing needs for the low pH developing solution, the composition of an image forming layer of a lithographic printing plate precursor has been improved so that it also dissolves in the low pH alkali developing solution. Lithographic printing plate precursors disclosed, for example, in Japanese Unexamined Patent Publication (Kokai) No. 2007-17913, Published Japanese Translation of PCT International Publication for Patent Application (Kohyo) No. 2009-524110, Japanese Unexamined Patent Publication (Kokai) No. 2009-98368, Published Japanese Translation of PCT International Publication for Patent Application (Kohyo) No. 2010-511202, and the like are lithographic printing plate precursors improved so as to be able to be treated with a low pH developing solution having a pH of 12 or lower. An image forming layer of these lithographic printing plate precursors contains no or few resin having a phenolic OH group in a structure of a phenol resin or a novolak resin. As mentioned above, the composition of the image forming layer of the lithographic printing plate precursor has been improved. However, a low pH alkali developing solution having satisfactory developability is still required regardless of whether it is a conventional developing solution for a positive working plate or developing solution for a negative plate.

The lithographic printing plate precursors comprising an image forming layer having improved composition disclosed in the above publications usually have a property, which enables easy penetration of a developing solution and also easier dissolution in the developing solution than before, so as to be able to be treated with a low pH developing solution. However, these lithographic printing plate precursors comprising an image forming layer having improved composition are likely to cause film thinning due to penetration of the developing solution into the image area when they have narrow development latitude and high development activity, and thus ink receptivity may sometimes deteriorate during printing. These lithographic printing plate precursors also have such a drawback that, if scratches exist on a surface of the lithographic printing plate before a developing treatment, the developing solution easily penetrates from the scratches and thus omission is likely to occur in the image area. These lithographic printing plate precursors also have various drawbacks that they exhibit narrower development latitude to the used developing solution after treatment of a lot of printing plate precursors (i.e. degraded developing solution), leading to decreased development speed of the exposed area and easy penetration of the developing solution into the unexposed area.

CITATION LIST

Patent Literature

[Patent Literature 1]
Published Japanese Translation of PCT International Publication for Patent Application (Kohyo) No. 2004-512555
[Patent Literature 2]
Published Japanese Translation of PCT International Publication for Patent Application (Kohyo) No. 2006-520935
[Patent Literature 3]
Japanese Unexamined Patent Publication (Kokai) No. 2004-271985

SUMMARY OF INVENTION

Technical Problem

An object of the present invention is to provide a novel low pH developing solution containing no inorganic strong alkali component to thereby overcome the above drawbacks from the viewpoint of the developing solution.

Solution to Problem

The present inventors have intensively studied a low pH alkali developing solution which has hitherto been used, and found that it is possible to provide a novel low pH alkali developing solution composition for the development of a lithographic printing plate, capable of achieving the above object, by using an alkali agent, a specific compound, a specific metal salt, and a specific polymer in combination.

Namely, the present invention provides an alkali developing solution composition for producing a lithographic printing plate, comprising (A) an alkali agent, (B) a compound represented by the formula (I) shown below, (C) a metal salt of Group 2 elements of the Periodic Table of the Elements, and (D) a polymer comprising carboxylic acid or a salt thereof.

The present invention also provides:

a method for producing a lithographic printing plate, comprising the steps of:

imagewise exposing a positive working lithographic printing plate precursor comprising, on a substrate having a hydrophilic surface, a lower layer comprising a resin which is water-insoluble and alkali-soluble or alkali-dispersible and an upper layer comprising a resin which is water-insoluble and alkali-soluble or alkali-dispersible formed on the lower layer, at least one of the lower layer and the upper layer comprising a photothermal conversion material, using an infrared laser; and developing the exposed lithographic printing plate precursor with the alkali developing solution composition according to any one of claims 1 to 8 to remove the exposed area, to form the image area and the non-image area.

Advantageous Effects of Invention

Use of the developing solution composition of the present invention enables a developing treatment which is stable over a long period. Sludge does not accumulate in a developing tank of an automatic processor and it is easy to wash the developing tank in the case of replacing a developing solution, thus enabling construction of a development system which is excellent in maintainability.

DESCRIPTION OF EMBODIMENTS

The developing solution composition of the present invention will be described in detail below. The alkali agent (A) used in the developing solution composition of the present invention may be either an inorganic alkali agent or an organic alkali agent. It is also possible to use an inorganic alkali agent together with the organic alkali agent. When using any one of them as the alkali agent of the developing solution composition of the present invention, an inorganic alkali agent of a strong alkali is not preferably used, but an organic alkali agent is preferably used. An inorganic alkali agent with low alkalinity can be used alone as the alkali agent of the developing solution composition of the present invention.

The organic alkali agent usable in the developing solution composition of the present invention includes, for example, monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, triisopropanolamine, ethyleneimine, ethylenediamine, pyridine, N-2-hydroxyethylenediamine, benzylamine, 2-(2-aminoethylamino)ethanol, 2-(2-aminoethoxyl)ethanol, sodium citrate, potassium citrate, sodium acetate, potassium acetate, sodium malate, sodium tartrate, and the like. Two or more kinds of these organic alkali agents may be used in combination. Of these, monoethanolamine, monoisopropanolamine, 2-(2-aminoethylamino)ethanol, and 2-(2-aminoethoxyl)ethanol are preferred.

The amount of the organic alkali agent in the developing solution composition is preferably from 0.05 to 90% by mass based on the total mass of the developing solution composition. The amount of the alkali agent is not preferred to be less than 0.05% by mass as failing to sufficiently develop the non-image area. The amount of the alkali agent is not preferred to be more than 90% by mass as increasing film loss of the image area. The amount of the organic alkali agent is more preferably from 0.1 to 50% by mass, and particularly preferably from 1 to 20% by mass, based on the total mass of the developing solution composition.

Although the strong alkali inorganic alkali agent is not preferred as mentioned above, an inorganic alkali agent with low alkalinity, for example, dibasic sodium phosphate ($Na_2HPO_4$), tribasic sodium phosphate ($Na_3PO_4$), or the like can be used alone as the alkali agent of the developing solution composition of the present invention.

It is also possible to use the inorganic alkali agent together with the organic alkali agent. When using the inorganic alkali agent together with the organic alkali agent, the total amount is at most 10% by mass based on the total mass of the developing solution composition. The total amount is not preferred to be more than 10% by mass as increasing film loss of the image area. The inorganic alkali agent usable together with the organic alkali agent includes, for example, sodium hydroxide, potassium hydroxide, sodium carbonate, potassium carbonate, sodium metasilicate, potassium metasilicate, dibasic sodium phosphate, tribasic sodium phosphate, and the like.

Another compound used in the developing solution composition of the present invention is (B) a compound represented by the formula (I) shown below. The compound as the component (B) has the effect of accelerating the development of the exposed area, and also suppressing the penetration of a developing solution into the unexposed area by using in combination with (C) a metal salt of Group 2 elements of the Periodic Table of the Elements. This effect is exerted particularly in the case of the used developing solution composition containing an image forming layer component dissolved therein. It has been found that, when the component (C) is absent, only the development accelerating effect to the exposed area is provided without exerting the effect of suppressing penetration of a developing solution into the unexposed area.

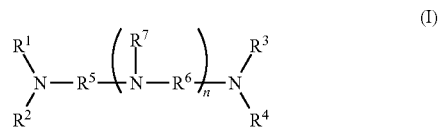

(I)

In the above formula, $R^1$ to $R^4$ each independently represents H, $R^8OH$, or $-(AO)_a(BO)_bR^9$. AO and BO are selected from an ethyleneoxy group and a propyleneoxy group, in which a and b represent an integer of from 0 to 300, but $(a+b) \neq 0$. $R^8$ represents a divalent linking group, $R^9$ represents H, $CH_3$, $COR^{10}$, or $CONHR^{11}$, and $R^{10}$ and $R^{11}$ represent an alkyl group, an aryl group, an alkenyl group, or an alkynyl group.

The alkyl group represented by $R^{10}$ and $R^{11}$ is preferably a linear or branched alkyl group having 1 to 25 carbon atoms, for example, $CH_3$—, $CH_3CH_2$—, $CH_3(CH_2)_2$—, $CH_3(CH_2)_3$—, $CH_3(CH_2)_4$—, $(CH_3)_2CH(CH_2)_2$—, $CH_3CH_2CH(CH_3)$—$CH_2$—, $CH_3(CH_2)_2CH(CH_3)$—, $CH_3(CH_2)_7$—, $CH_3(CH_2)_8$—, $CH_3(CH_2)_{10}$—$CH_3(CH_2)_{12}$—, $CH_3(CH_2)_{14}$—, $C(CH_2)_{16}$—, $CH_3(CH_2)CH_3(CH_2)_{16}$—, $CH_3(CH_2)_{18}$, $CH_3(CH_2)_{20}$—, $CH_3(CH_2)_{22}$—, $CH_3(CH_2)_{24}$—, or the like. The aryl group represented by $R^{10}$ and $R^{11}$ includes, for example, a monocyclic or bicyclic aryl group such as phenyl,

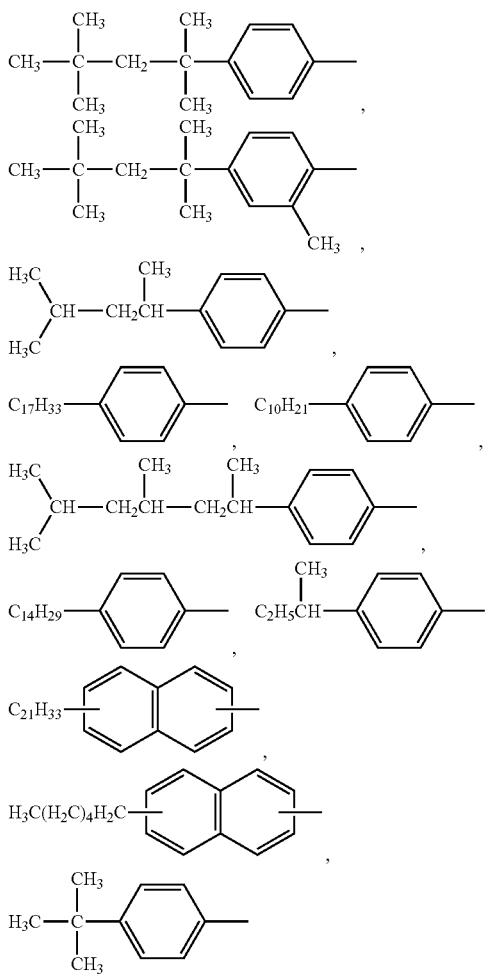

and an aryl group having a substituent such as a linear or branched alkyl group.

The alkenyl group or alkynyl group represented by $R^{10}$ and $R^{11}$ includes, for example, those having 9 to 24 carbon atoms, such as $CH_2=CH(CH_2)_7$—, $CH_2CH_2CH=CH(CH_2)_7$—, $CH_3(CH_2)_5CH=CH$—, $CH_3(CH_2)_7CH=CH$— $CH_3(CH_2)_5CH(OH)CH_2CH_2CH=CH(CH_2)_7$—, $CH_3(CH_2)_{10}CH=CH(CH_2)_4$—, $CH_3(CH_2)_5CH=CH(CH_2)_9$—, $CH_3(CH_2)_4CH=CHCH_2CH=CH(CH_2)_7$—, $CH_3CH_2CH=CHCH_2CH=CH(CH_2)$—, $CH_3(CH_2)_3(CH=CH)_3(CH_2)_7$—, $CH_3(CH_2)_8(CH=CH)_3$ $(CH_2)_4CO(CH_2)_2$—, $CH_3(CH_2)_7C\equiv C(CH_2)_7$—, and $CH_3(CH_2)_9CH=CH(CH_2)_7$—.

$R^5$ and $R^6$ each independently represents a divalent linking group and may be the same or different. Examples of $R^5$ and $R^6$ include an alkylene group such as an ethylene group or a propylene group.

$R^7$ can be selected from groups defined in aforementioned $R^1$ to $R^4$. Alternatively, $R^7$ can be selected from the substituent group represented by the following formula (II):

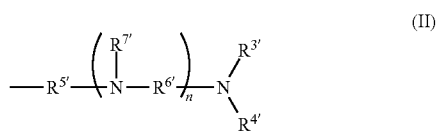

wherein $R^{3\prime}$ is the same as $R^3$ defined in the formula (I), $R^{4\prime}$ is the same as $R^4$ defined in the formula (I), $R^{5\prime}$ is the same as $R^5$ defined in the formula (I), $R^{6\prime}$ is the same as $R^6$ defined in the formula (I), and $R^{7\prime}$ is the same as $R^7$ defined in the formula (I).

n in the formulas (I) and (II) represents an integer of 0 to 20 and, when n is 2 or more, $R^7$ and $R^{7\prime}$ each can be independently selected.

Specifically, the compound represented by the general formula (I) is, for example, a compound represented by the following formula (I-1).

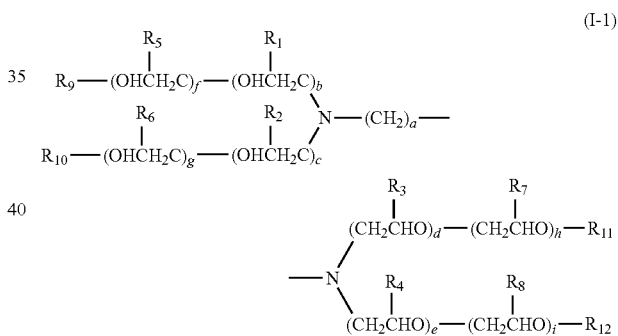

In the above formula, $R_1$ to $R_8$ may be the same or different and represent H or $CH_3$, and $R_9$ to $R_{12}$ may be the same or different and represent H, $CH_3$, $COR_{13}$, or $CONHR_{14}$, in which $R_{13}$ and $R_{14}$ represent an alkyl group, an aryl group, an alkenyl group, or an alkynyl group, a represents an integer of 2 to 12, b, c, d, e, f, g, h, and i may be the same or different and represent an integer of 0 to 300, and (b+f)(c+g)(d+h)(e+i)≠0.

Of the compounds represented by aforementioned general formula (I-1), particularly preferred compound is a compound in which $R_1$ to Re represent H or $CH_3$ and the end is a hydroxyl group, namely, $R_9$, $R_{10}$, $R_{11}$, and $R_{12}$ entirely represent H, and an average molecular weight is from 280 to 1,100.

The group represented by $R_{13}$ and $R_{14}$ in aforementioned general formula (I-1) can be selected from groups listed in $R^{10}$ and $R^{11}$ of the formula (I).

Specifically, the compound represented by the general formula (I) can be a compound represented by the following formula (I-2).

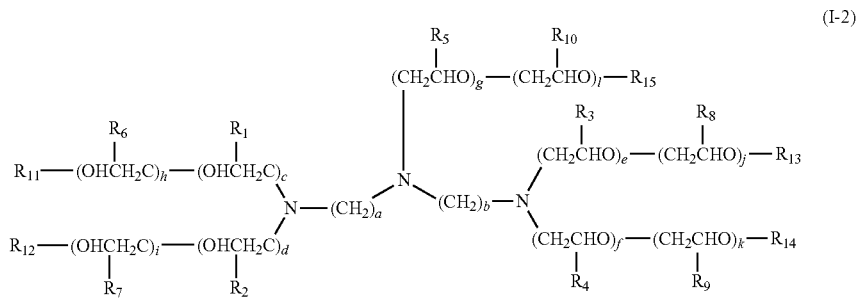

In the above formula, $R_1$ to $R_{10}$ may be the same or different and represent H or $CH_3$, $R_{11}$ to $R_{15}$ may be the same or different and represent H, $CH_3$, $COR_{16}$, or $CONHR_{17}$, in which $R_{16}$ and $R_{17}$ and represent an alkyl group, an aryl group, an alkenyl group, or an alkynyl group, a and b and represent an integer of 2 to 12, and c, d, e, f, g, h, i, j, k, and l may be the same or different and represent an integer of 0 to 300 and (c+h) (d+i) (e+j)(f+k) (g+l)≠0.

Of the above compounds represented by the general formula (I-2), particularly preferred compound is a compound in which $R_1$ to $R_{10}$ represent H or $CH_3$ and the end is a hydroxyl group, namely, $R_{11}$, $R_{12}$, $R_{13}$, $R_{14}$, and $R_{15}$ entirely represent H, and an average molecular weight is from 320 to 1,300.

The group represented by $R_{16}$ and $R_{17}$ in aforementioned general formula (I-1) can be selected from groups listed in $R^{10}$ and $R^{11}$ of the formula (I).

Specific examples of the compound represented by the general formula (I) include Adeka Polyether EDP-300 (manufactured by ADEKA CORPORATION, ethylenediaminepropylene oxide-modified product: molecular weight of 300), EDP-450 (manufactured by ADEKA CORPORATION, ethylenediaminepropylene oxide-modified product: molecular weight of 450), and Adeka Polyether BM-34 (manufactured by ADEKA CORPORATION, ethylenediamineethylene oxide-modified product: molecular weight of 280). It is also possible to exemplify propylene oxide-modified products of diethylenetriamine, such as N,N,N',N'',N''-pentakis(2-hydroxypropyl)diethylenetriamine, an ethylene oxide-modified product of diethylenetriamine, a propylene oxide-modified product of dipropylenetriamine, and an ethylene oxide-modified product of dipropylenetriamine.

Examples of the compound of the general formula (I) in which n is 4 or more include propylene oxide-modified polyethyleneimine, a propylene oxide-modified product of triethylenetetramine, and a propylene oxide-modified product of tetraethylenepentamine.

For example, polyethyleneimine (propylene oxide-modified polyethyleneimine, manufactured by Nippon Shokubai Co., Ltd.) is represented by the following formula.

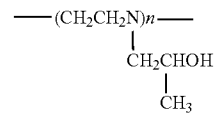

$n = 14$

The compound represented by the general formula (I) can also include a compound having a branched structure as shown below.

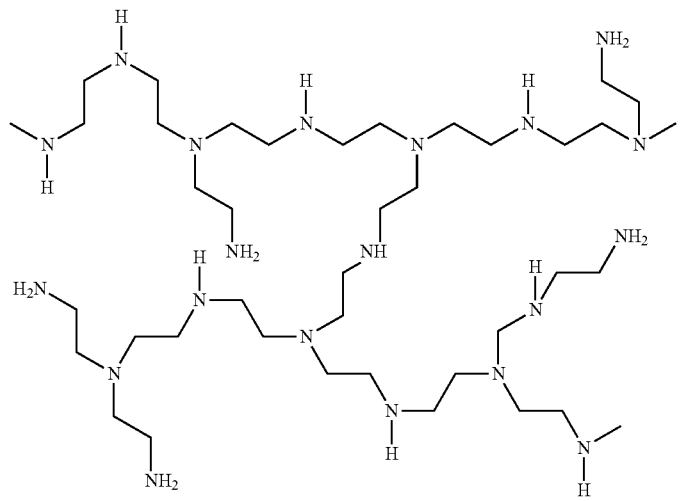

-continued

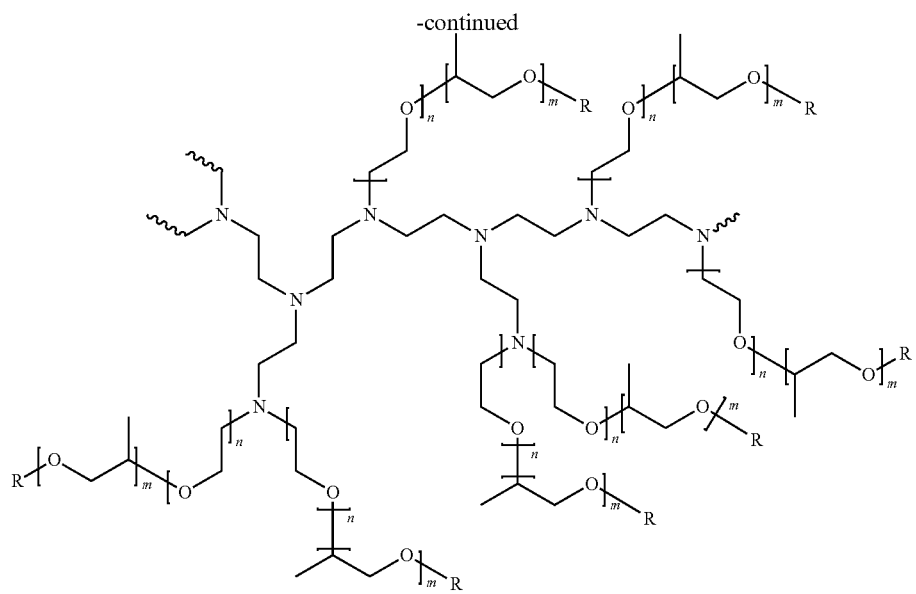

It is also possible to use a compound of the general formula (I) in which n is 21 or more. However, it is preferred to use a compound of the general formula (I) in which n is up to 20 in the developing solution composition of the present invention since the obtained developing solution composition has high viscosity and may exhibit insufficient solubility in water depending on the modified type compound.

The use amount of the compound represented by the general formula (I) as the component (B) is preferably from 0.001 to 10% by mass, and more preferably from 0.01 to 5% by mass, based on the entire amount of the developing solution composition. The use amount of the component (B) is not preferred to be less than 0.001% by mass as failing to obtain aforementioned effect. The use amount of the component (B) is not preferred to be more than 10% by mass as exerting an adverse influence on compatibility with other components.

Still another component used in the developing solution composition of the present invention is (C) a metal salt of Group 2 elements of the Periodic Table of the Elements. The metal salt as the component (C) can suppress the penetration of a developing solution into the image area. Group 2 elements are beryllium, magnesium, calcium, strontium, and barium. In the developing solution composition of the present invention, these elements are used in the form of a metal salt. Specifically, the metal salt is, for example, a halide, a carbonate, a sulfate, a nitrate, a phosphate, a formate, an acetate, a propionate, a maleate, a lactate, a levulinate, a malonate, an adipate, or a fumarate. Of these, a halide, a carbonate, a sulfate, a nitrate, a phosphate, and an acetate are preferred, and particularly preferred metal salts are calcium chloride and magnesium chloride.

The use amount of the metal salt of Group 2 elements is preferably from 0.01 to 5% by mass, and more preferably from 0.05 to 1% by mass, based on the entire amount of the developing solution composition. The use amount of the metal salt of Group 2 elements is not preferred to be more than 5% by mass as causing drastic deterioration of developability of the exposed area.

Yet another component used in the developing solution composition of the present invention is (D) a polymer comprising carboxylic acid or a salt thereof. Usually, metal ions as the component (C) are likely to be combined with carbon dioxide in air in an aqueous alkali solution to thereby precipitate as a carbonate. Coexistence of the polymer comprising carboxylic acid or a salt thereof suppresses the precipitation of the component (C), thus enabling the existence of the component (C) stably in the alkali developing solution. The component (D) can accelerate the development to the exposed area delayed by the addition of the component (C) to the developing solution composition. Specifically, the polymer comprising carboxylic acid or a salt thereof usable in the developing solution composition of the present invention is a compound comprising a structural unit represented by the following formula (III).

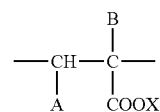

In the above formula, B represents a hydrogen atom, an alkyl group having 1 to 3 carbon atoms, or an —$R^a$—COOX group, in which $R^a$ represents an alkylene group which may have a substituent, A represents a hydrogen atom, a carbamoyl group, an alkoxycarbonyl group, a carboxyl group, or a salt thereof, and X represents a hydrogen atom, an alkali metal atom, a protonated organic amine group, or a quaternary ammonium group.

The polymer comprising carboxylic acid or a salt thereof usable in the present invention includes, for example, a homopolymer of a monomer having an acid group, or a copolymer with other monomers, such as a polyacrylic acid (salt), a polymethacrylic acid (salt), an acrylic acid-maleic acid copolymer (salt), a polyitaconic acid (salt), a polymaleic acid (salt), or a styrene-acrylic acid copolymer (salt). Examples of the polymer in which A in the formula (III) is a carbamoyl group or an alkoxycarbonyl group include polymers in which a (co)polymer comprising maleic anhydride has been modified with ammonia, amine, or alcohols. Of these, particularly preferred polymer is an acrylic acid-maleic acid copolymer sodium or a sodium polyacrylate.

The use amount of (D) the polymer comprising carboxylic acid or a salt thereof is preferably from 0.01 to 20% by mass, and more preferably from 0.1 to 10% by mass, based on the entire amount of the developing solution composition. The use amount of (D) the polymer comprising carboxylic acid or a salt thereof is not preferred to be less than 0.01% by mass as failing to obtain aforementioned effect. The use amount thereof is not preferred to be more than 20% by mass since a developing solution may penetrate into the image area, thus causing increase of film loss.

Regarding (C) the metal salt of Group 2 elements of the Periodic Table of the Elements and (D) the polymer comprising carboxylic acid or a salt thereof, a molar ratio of metal ions as the component (C) to carboxylic acid as the component (D) is preferably from 1:2 to 1:40, and more preferably from 1:3 to 1:20. The ratio is not preferred to be less than 1:2 since developability of the non-image area deteriorates to cause development residue in the non-image area, and also the metal salt (C) is likely to precipitate as an insoluble substance like a carbonate in a developing solution. The ratio is not preferred to be more than 1:40 since the effect of suppressing the penetration of a developing solution into the image area of the component (C) deteriorates and a developing solution penetrates into the image area, thus causing increase of film loss.

To the developing solution composition of the present invention, a surfactant, an organic solvent, and the like can be added, in addition to aforementioned essential components (A) to (D).

Preferred surfactant includes alkali metal salts of alkylnaphthalene sulfonates, alkali metal salts of alkylbenzene sulfonates, alkali metal salts of alkyldiphenylether disulfonates, alkali metal salts of dialkylsulfosuccinic acids, alkali metal salts of sulfuric acid monoesters of aliphatic alcohols having typically 6 to 9 carbon atoms, and alkali metal salts of sulfonic acids having typically 6 to 9 carbon atoms. Preferred alkali metal is sodium. The surfactant or a mixture of the surfactant is typically included in the amount of about 0.5% by mass to about 15% by mass, and preferably about 3% by mass to about 8% by mass, based on the mass of the developing solution composition. As is well known to those skilled in the art, most surfactants are supplied in the form of an aqueous surfactant solution. Percentage of these surfactants is based on the amount of the surfactant in the developing solution (i.e. mass of an active component, namely, components except water in the aqueous surfactant solution and other inert materials).

The organic solvent which can be added to the developing solution composition of the present invention includes, for example, ethyl acetate, butyl acetate, amyl acetate, benzyl acetate, ethylene glycol monobutyl acetate, butyl lactate, butyl levulinate, methyl ethyl ketone, ethyl butyl ketone, methyl isobutyl ketone, cyclohexanone, ethylene glycol monobutyl ether, ethylene glycol monobenzyl ether, ethylene glycol monophenyl ether, benzyl alcohol, methyl phenyl carbitol, n-amyl alcohol, methylamyl alcohol, xylene, methylene dichloride, ethylene dichloride, monochlorobenzene, 2-phenoxyethanol, methylcyclohexanol, cyclohexanol, ethylene glycol dibutyl ether, cyclohexanone, methylcyclohexanone, n-butyl ethyl ketone, and the like. The amount of the organic solvent to be added to the developing solution composition is preferably 20% by mass or less, and particularly preferably 10% by mass or less.

The developing solution composition can also contain a buffer system which comparatively constantly maintains the pH. A lot of buffer systems are known to those skilled in the art. Typical buffer system contains, for example, a combination of a water-soluble amine such as monoethanolamine, diethanolamine, triethanolamine, or tri-i-propylamine, and sulfonic acid such as benzenesulfonic acid or 4-toluenesulfonic acid; a mixture of a tetrasodium salt of ethylenediaminetetraacetic acid (EDTA) and EDTA; a mixture of a phosphate salt, such as a mixture of a monoalkyl phosphate salt and a trialkyl phosphate salt; and a mixture of an alkali borate and boric acid.

It is also possible to optionally add, to the developing solution composition, a water-soluble sulfite such as lithium sulfite, sodium sulfite, potassium sulfite, or magnesium sulfite; a hydroxyaromatic compound such as an alkali-soluble pyrazolone compound, an alkali-soluble thiol compound, or methylresorcine; and water softeners and various defoamers, such as polyphosphate and aminopolycarboxylic acids.

The developing solution composition of the present invention has a pH of at most about 12, and preferably at most about 11.

A lithographic printing plate precursor treatable with the developing solution composition of the present invention will be described.

The treatable lithographic printing plate precursor includes, on a substrate, a lower layer, and includes an upper layer on the lower layer. The lower layer and the upper layer constitute an image forming layer of the lithographic printing plate precursor. An intermediate layer may be optionally formed between the substrate and the lower layer, and it is preferred that the intermediate layer does not exist between the lower layer and the upper layer. A backcoat layer may be optionally formed on a back surface of the substrate.

<Lower Layer>

The lower layer constituting the lithographic printing plate precursor contains a resin which is soluble or dispersible in an aqueous alkali solution. In order to be soluble or dispersible in an aqueous alkali solution, the resin preferably has at least a functional group such as a carboxyl group, a sulfonic acid group, a phosphoric acid group, a phosphonic acid group, an active imino group, or a sulfonamide group. Therefore, the resin soluble or dispersible in an aqueous alkali solution used in the lower layer can be suitably formed by polymerizing a monomer mixture comprising one or more ethylenically unsaturated monomers having a functional group such as a carboxyl group, a sulfonic acid group, a phosphoric acid group, a phosphonic acid group, an active imino group, a sulfonamide group, and a combination thereof.

The ethylenically unsaturated monomer can be a compound represented by the following formula:

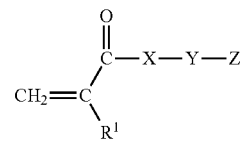

wherein $R^1$ represents a hydrogen atom, a $C_{1-22}$ linear, branched, or cyclic alkyl group, a $C_{1-22}$ linear, branched, or cyclic substituted alkyl group, a $C_{6-24}$ aryl group, or a substituted aryl group, the substituent being selected from a $C_{1-4}$ alkyl group, an aryl group, a halogen atom, a keto group, an ester group, an alkoxy group, or a cyano group; X is O, S, and $NR^2$, in which $R^2$ is hydrogen, a $C_{1-22}$ linear, branched, or cyclic alkyl group, a $C_{1-22}$ linear, branched, or cyclic substituted alkyl group, a $C_{6-24}$ aryl group, or a substituted aryl group, the substituent being selected from a $C_{1-4}$ alkyl group, an aryl group, a halogen atom, a keto group, an ester group, an alkoxy group, or a cyano group; Y is a single bond, or $C_{1-22}$ linear, branched, or cyclic alkylene, alkyleneoxyalkylene, poly(alkyleneoxy)alkylene, or alkylene-NHCONH—; and Z is a hydrogen atom, a hydroxyl group, a carboxyl group, —$C_6H_4$—$SO_2NH_2$, —$C_6H_3$—$SO_2NH_2$ (—OH), —$OPO_3H_2$, —$PO_3H_2$, or a group represented by the following formula:

or a mixture thereof.

Examples of the unsaturated ethylene monomer include, in addition to acrylic acid and methacrylic acid, compounds represented by the following formulas, and a mixture thereof.

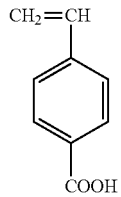 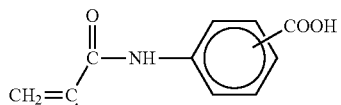

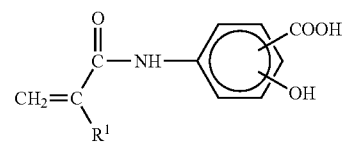

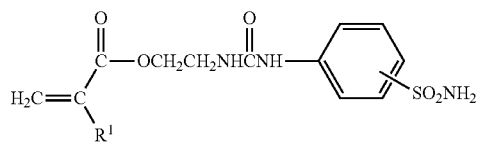

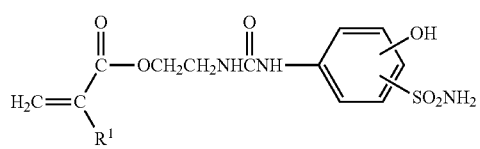

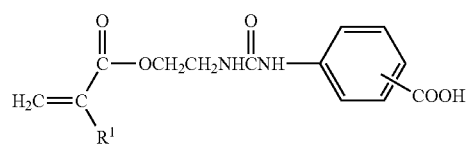

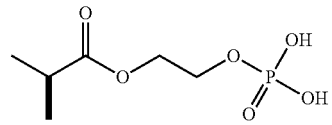

Ethylene glycol methacrylate phosmer ("Phosmer M", manufactured by Uni Chemical

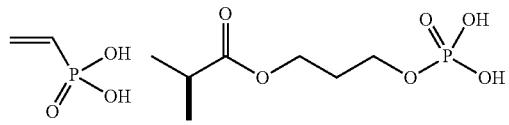

Vinylphosphonic acid    1,3-Propylene glycol methacrylate phosphate

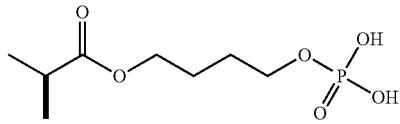

1,4-n-Butylene glycol methacrylate phosphate

The weight average molecular weight of the resin which is water-insoluble and alkali-soluble or alkali-dispersible is preferably within a range from 20,000 to 100,000. When the weight average molecular weight of the water resin which is water-insoluble and alkali-soluble or alkali-dispersible is less than 20,000, the resin may be inferior in solvent resistance and durability. In contrast, when the weight average molecular weight of the resin which is water-insoluble and alkali-soluble or alkali-dispersible is more than 100,000, the resin may be inferior in alkali developability.

The content of the resin soluble or dispersible in an aqueous alkali solution in the lower layer is preferably within a range from 20 to 95% by mass based on the solid content of the layer. The content of the resin soluble or dispersible in an aqueous alkali solution is disadvantageous to be less than 20% by mass in view of chemical resistance. The content of the resin soluble or dispersible in an aqueous alkali solution is not preferred to be more than 95% by mass in view of an exposure speed. It is also possible to optionally use two or more resins soluble or dispersible in an aqueous alkali solution in combination.

<Upper Layer>

The upper layer constituting the lithographic printing plate precursor contains an alkali-soluble or alkali-dispersible resin. The alkali-soluble or alkali-dispersible resin usable in the upper layer is preferably a resin having a carboxylic acid or acid anhydride group, and examples thereof include a copolymer obtained by polymerizing a monomer mixture comprising either of an unsaturated carboxylic acid and an unsaturated carboxylic anhydride, or both an unsaturated carboxylic acid and an unsaturated carboxylic anhydride, a polyurethane having an acidic hydrogen atom-containing substituent, and the like. Examples of the unsaturated carboxylic acid include acrylic acid, methacrylic acid, maleic acid, itaconic acid, and the like, and examples of the unsaturated carboxylic anhydride include maleic anhydride, itaconic anhydride, and the like. Examples of the copolymerizable unsaturated ethylene monomer unit include other unsaturated ethylene comonomers.

<Photothermal Conversion Material>

At least one of the lower layer and the upper layer contains a photothermal conversion material. It is considered that, if the lower layer of the lithographic printing plate precursor contains a photothermal conversion material and the upper layer does not contain a photothermal conversion material, when an image is written on the lithographic printing plate precursor by a laser, the photothermal conversion material of the lower layer converts laser light into heat and heat is transferred to the upper layer, and thus a partial molecular structure of the alkali-soluble or alkali-dispersible resin of the uppermost layer is collapsed to form pores in the upper layer, thus enabling penetration of the developing solution into the lower layer.

The photothermal conversion material means any material capable of converting an electromagnetic wave into thermal energy, and is a material having a maximum absorption wavelength in a near infrared to infrared region, specifically a material having a maximum absorption wavelength within a range from 760 to 1,200 nm. Examples of such a material include various pigments and dyes.

It is possible to use, as the pigments, commercially available pigments disclosed, for example, in Color Index Handbook, "Latest Pigment Handbook" (edited by Nihon Pigment Technique Society, published in 1977), "Latest Pigment Application Technique" (published by CMC in 1986), "Printing Ink Technique" (published by CMC in 1984), and the like. Applicable types of pigments include black, yellow, orange, brown, red, violet, blue, green pigments, fluorescent pigments, polymer-grafted pigments, and the like. Specifically, it is possible to use insoluble azo pigments, azo lake pigments, condensed azo pigments, chelated azo pigments, phthalocyanine pigments, anthraquinone pigments, perylene and perinone pigments, thioindigo pigments, quinacridone pigments, dioxazine pigments, isoindolinone pigments, quinophthalone pigments, lake pigments, azine pigments, nitroso pigments, nitro pigments, natural pigments, fluorescent pigments, inorganic pigments, carbon black, and the like.

It is possible to use, as the dyes, conventionally known commercially available dyes disclosed, for example, in "Dye Handbook" (edited by the Association of Organic Synthesis Chemistry, published in 1970), "Handbook of Color Material Engineering" (edited by the Japan Society of Color Material, Asakura Shoten K. K., published in 1989), "Technologies and Markets of Industrial Dyes" (published by CMC in 1983), "Chemical Handbook, Applied Chemistry Edition" (edited by The Chemical Society of Japan, Maruzen Shoten K. K., published in 1986), and the like. More specific examples of dyes include azo dyes, metal complex azo dyes, pyrazolone azo dyes, anthraquinone dyes, phthalocyanine dyes, carbonium dyes, quinonimine dyes, methine dyes, cyanine dyes, indigo dyes, quinoline dyes, nitro-based dyes, xanthene-based dyes, thiazine-based dyes, azine dyes, oxazine dyes, and the like.

It is possible to use, as the dyes capable of efficiently absorbing near infrared rays or infrared rays, azo dyes, metal complex azo dyes, pyrazolone azo dyes, naphthoquinone dyes, anthraquinone dyes, phthalocyanine dyes, carbonium dyes, quinoneimine dyes, methine dyes, cyanine dyes, squalirium dyes, pyrylium salts, metal thiolate complexes (for example, nickel thiolate complex), and the like. Of these, cyanine dyes are preferred, and cyanine dyes represented by the general formula (I) of Japanese Unexamined Patent Publication (Kokai) No. 2001-305722 and compounds disclosed in paragraphs [0096] to [0103] of Japanese Unexamined Patent Publication (Kokai) No. 2002-079772 can be exemplified.

The photothermal conversion material is particularly preferably a dye represented by the following formula:

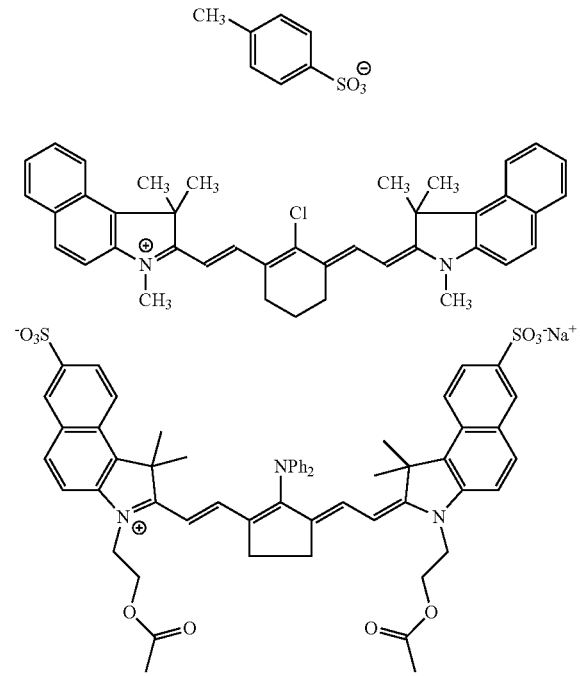

wherein Ph represents a phenyl group.

The lithographic printing plate precursor of the present invention may contain a matting agent in the uppermost layer or a mat layer may be formed on the uppermost layer for the purpose of improving de-interleaving paper property and improving a plate transportation property of an automatic plate loader.

<Substrate>

Examples of the substrate include metal plates such as aluminum, zinc, copper, stainless steel, and iron plates; plastic films such as polyethylene terephthalate, polycarbonate, polyvinyl acetal, and polyethylene films; composite materials obtained by vacuum-depositing or laminating a metal layer on papers or plastic films on which a synthetic resin is melt-coated or a synthetic resin solution is coated; and materials used as the substrate of the printing plate. Of these substrates, aluminum and composite substrates coated with aluminum are preferably used.

The surface of the aluminum substrate is preferably subjected to a surface treatment for the purpose of enhancing water retentivity and improving adhesion with the lower layer or the intermediate layer formed optionally. Examples of the surface treatment include surface roughening treatments such as brush graining, ball graining, electrolytic etching, chemical etching, liquid honing, sand blasting, and a combination thereof. Of these surface treatments, a surface roughening treatment including the use of electrolytic etching is preferred.

EXAMPLES

The present invention will be described in more detail below by way of Examples. However, the present invention is not limited to these Examples.

Synthesis of Material for Intermediate Layer Provided on Substrate
<Polymer 1>
Vinylphosphonic Acid/Acrylamide Copolymer (Molar Ratio of 1:9)

In a 10 liter flask equipped with a stirrer, a capacitor, and a dropping device, 3,500 g of ethanol was charged and then heated to 70° C. After dissolving 231.1 g (2.14 mol) of a vinylphosphonic acid monomer, 1368.9 g (19.26 mol) of acrylamide, and 52 g of AIBN in 1,000 g of ethanol, this solution was added dropwise in a reactor over 4 hours. During dropwise addition of the monomer solution, a white precipitate was formed. While maintaining at 70° C., the monomer solution was heated and stirred for 2 hours, followed by stopping of heating and further cooling to room temperature. The precipitated white powder was separated by filtration, washed with 1,000 g of ethanol and then dried.

Preparation of Substrate

A 0.24 mm thick aluminum plate was degreased in an aqueous sodium hydroxide solution and then subjected to an electrolytic graining treatment in a 2% hydrochloric acid bath to obtain a grained plate having a center line average roughness (Ra) of 0.5 µm. Then, the grained plate was subjected to an anodizing treatment in a 20% sulfuric acid bath at a current density of 2 A/dm² to form an anodic oxide film (2.7 g/m²). After washing with water and drying, an aluminum substrate was obtained. The substrate thus obtained was immersed in an aqueous 0.5 g/L solution of a polymer 1 heated to 60° C. for 10 seconds, washed with water and then dried. Thus, a substrate for lithographic printing plate precursor was obtained.

Preparation of Coating Solution for Two-Layered Image Forming Layer
Preparation of Coating Solution for Lower Layer A coating solution for lower layer shown in Table 1 below was prepared.

TABLE 1

Coating solution B-1 for lower layer

| Components | Unit: g |
|---|---|
| Methyl ethyl ketone | 47.50 |
| Propylene glycol monomethyl ether | 28.50 |
| γ-Butyrolactone | 9.50 |
| Water | 9.50 |
| Copolymer of acrylonitrile/methactylamide/methacrylic acid/styrene/vinylphosphonic acid/p-vinylbenzoic acid (weight ratio: 50/10/10/10/10/10, Mw = 50,000) | 2.50 |
| Copolymer of acrylonitrile/methactylamide/2-(N'-(4-hydroxyphenyl)ureido)ethyl methacrylate (weight ratio: 40/20/40, Mw = 20,000) | 0.50 |
| Copolymer of dimethylolpropionic acid/bis(4-(2-hydroxyethoxy)phenylsulfone/diphenylmethane diisocyanate (weight ratio: 22.5/22.5/55, Mw = 6,000) | 0.50 |
| ARASTAR-700*[1] | 0.50 |
| 4-Dimethylaminobenzoic acid | 0.10 |
| PS210CNE*[2] | 0.50 |
| Brilliant Green | 0.05 |
| Polyethylene Glycol 300 | 0.10 |
| Fuluorinated polymer 1*[3] | 0.05 |
| Fuluorinated polymer 2*[4] | 0.10 |
| DOW CORNING TORAY 8019 ADDITIVE*[5] | 0.05 |
| Total | 100.00 |

*[1]Styrene-maleic acid ester resin (manufactured by Arakawa Chemical Industries, Ltd.)
*[2]IR Dye (manufactured by Nippon Kayaku Co., Ltd.)
*[3]Copolymer of perfluorooctylethyl acrylate/poly(oxypropylene) acrylate (n = 6) (molar ratio: 35/65)
*[4]Copolymer of perfluorooctylethyl acrylate/2-hydroxyethyl methacrylate/benzyl methacrylate/N-phenylmaleimide (molar ratio: 30/20/10/40))
*[5]Polyether-modified silicone-based surfactant (manufactured by Dow Corning Toray Co., Ltd.)

Preparation Coating Solution for Upper Layer

A coating solution for upper layer shown in Table 2 was prepared.

TABLE 2

Coating solution T-1 for upper layer

| Components | Unit: g |
|---|---|
| Methyl ethyl ketone | 45.00 |
| Propylene glycol monomethyl ether | 45.00 |
| Propylene glycol monomethyl ether acetate | 9.50 |
| Copolymer of dimethylolpropionic acid/bis(4-(2-hydroxyethoxy)phenylsulfone/1,10-decanediol/*[6] PF-6320/diphenylmethane diisocyanate/2,4-tolylene diisocyanate (weight ratio: 20/17/5/10/40/8, Mw = 16,000) | 2.94 |
| Ammonia-modified product (Mw = 9,000) of styrene/maleic anhydride copolymer (molar ratio: 3/1) | 0.40 |
| 4-Dimethylaminobenzoic acid | 0.24 |
| Cyanine IR Dye | 0.12 |
| Acid Red 52 | 0.20 |
| Fuluorinated polymer 1*[3] | 0.05 |
| DOW CORNING TORAY 8019 ADDITIVE*[5] | 0.05 |
| Total | 100.00 |

*[3]Copolymer of perfluorooctylethyl acrylate/poly(oxypropylene) acrylate (n = 6) (molar ratio: 35/65)
*[5]Polyether-modified silicone-based surfactant (manufactured by Dow Corning Toray Co., Ltd.)
*[6]Hydroxy-terminated fluorinated polyether manufactured by OMNOVA Solutions Inc.

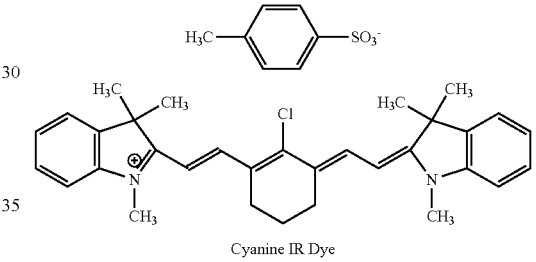

Cyanine IR Dye

Production of Lithographic Printing Plate Precursor

Using a roll coater, the coating solution for lower layer (B-1) prepared according to the composition shown in Table 1 was coated on the substrate obtained by the above method for the preparation of a substrate, and then dried at 100° C. for 2 minutes to obtain a first image forming layer. At this time, the amount of a dry coating film was 1.5 g/m². Using a roll coater, the coating solution for upper layer (T-1) prepared according to the composition shown in Table 2 was coated on this first image forming layer, and then dried at 100° C. for 2 minutes to obtain a two-layered lithographic printing plate precursor. Only the image forming layer of the upper layer was peeled by methyl isobutyl ketone, and then the amount of the dry coating film the image forming layer of the upper layer was determined. At this time, the amount of the dry coating film the image forming layer of the upper layer was 0.5 g/m².

Furthermore, a protective material (moisture content of 2.5%, material: natural pulp paper, thickness of 70 µm, weight of 45 g/m²) was supplied on a photosensitive layer surface of the two-layered lithographic printing plate precursor obtained above, and then 30 sheets of the printing plate precursor and the papers were alternately stacked on a plastic pallet. Thereafter, side and top surfaces were surrounded by a particular polyolefin film so as not to contain air, followed by a conditioning treatment at 60° C. for 24 hours. Thus, a two-layered lithographic printing plate precursor A was produced.

Preparation of Developing Solution

In accordance with each composition shown in Tables 3 and 4, various developing solutions were prepared.

In the developing solution 1, calcium chloride dehydrate as (C) a metal salt of elements belonging to Group 2 of the Periodic Table of the Elements, a sodium salt (40% aqueous solution) of an acrylic acid-maleic acid copolymer (molar ratio of 40:60) as (D) a polymer comprising carboxylic acid or a salt thereof, and Adeka Polyether EDP-300 as (B) a compound represented by the general formula (I) were respectively added. The developing solution 2 was prepared in accordance with the same composition as in the developing solution 1, except that Adeka Polyether EDP-300 of the developing solution 1 was replaced by N,N,N',N'',N''-pentakis(2-hydroxypropyl)diethylenetriamine. The developing solution 3 was prepared in accordance with the same composition as in the developing solution 1, except that Adeka Polyether EDP-300 of the developing solution 1 was replaced by EPOMIN PP-061. The developing solution 4 was prepared in accordance with the same composition as in the developing solution 1, except that Adeka Polyether EDP-300 of the developing solution 1 was replaced by Adeka Polyether EDP-450. The developing solution 5 was prepared in accordance with the same composition as in the developing solution 1, except that Adeka Polyether EDP-300 of the developing solution 1 was replaced by Adeka Polyether BM-34. In the developing solution 6, developing solution components were adjusted so that a molar ratio of metal ions of the component (C) to carboxylic acid (D) becomes 1:2.3. In the developing solution 7, developing solution components were adjusted so that a molar ratio of metal ions of the component (C) to carboxylic acid (D) becomes 1:18.8.

TABLE 4

Developing solution composition examples 6 to 7

| Components | Developing solution 6 | Developing solution 7 |
| --- | --- | --- |
| Deionized water | 654.25 | 527.32 |
| Calcium chloride dihydrate | 3.75 | 3.75 |
| 40% Aqueous solution of sodium salt of acrylic acid-maleic acid copolymer (molar ratio of 40:60) | 12.0 | — |
| 40% Aqueous solution of sodium salt of styrene-acrylic acid copolymer (molar ratio of 70.1:20.9) | — | 138.93 |
| Adeka Polyether EDP-300 | 50.0 | 50.0 |
| N,N,N',N'',N''-pentakis(2-hydroxypropyl)diethylenetriamine | — | — |
| EPOMIN PP-061 | — | — |
| Adeka Polyether EDP-450 | — | — |
| Adeka Polyether BM-34 | — | — |
| PELEX NBL | 140.0 | 140.0 |
| Benzyl alcohol | 30.0 | 30.0 |
| 2-(2-Aminoethoxy)ethanol | 75.0 | 75.0 |
| Trisiopropanolamine | 30.0 | 30.0 |
| Succinic acid | 5.0 | 5.0 |
| (C):(D) Carboxylic acid (molar ratio) | 1:2.3 | 1:18.8 |

In accordance with the composition shown in Table 5, developing solutions 8 to 14 were prepared as developing solutions for Comparative Examples.

TABLE 3

Developing solution composition examples 1 to 5

| Components | Developing solution 1 | Developing solution 2 | Developing solution 3 | Developing solution 4 | Developing solution 5 |
| --- | --- | --- | --- | --- | --- |
| Deionized water | 641.25 | 641.25 | 641.25 | 641.25 | 641.25 |
| Calcium chloride dihydrate | 3.75 | 3.75 | 3.75 | 3.75 | 3.75 |
| 40% Aqueous solution of sodium salt of acrylic acid-maleic acid copolymer (molar ratio of 40:60) | 25.0 | 25.0 | 25.0 | 25.0 | 25.0 |
| Adeka Polyether EDP-300 | 50.0 | — | — | — | — |
| N,N,N',N'',N''-pentakis(2-hydroxypropyl)diethylenetriamine | — | 50.0 | — | — | — |
| EPOMIN PP-061 | — | — | 50.0 | — | — |
| Adeka Polyether EDP-450 | — | — | — | 50.0 | — |
| Adeka Polyether BM-34 | — | — | — | — | 50.0 |
| PELEX NBL | 140.0 | 140.0 | 140.0 | 140.0 | 140.0 |
| Benzyl alcohol | 30.0 | 30.0 | 30.0 | 30.0 | 30.0 |
| 2-(2-Aminoethoxy)ethanol | 75.0 | 75.0 | 75.0 | 75.0 | 75.0 |
| Trisiopropanolamine | 30.0 | 30.0 | 30.0 | 30.0 | 30.0 |
| Succinic acid | 5.0 | 5.0 | 5.0 | 5.0 | 5.0 |
| (C):(D) Carboxylic acid (molar ratio) | 1:4.7 | 1:4.7 | 1:4.7 | 1:4.7 | 1:4.7 |

EPOMIN PP-061: 50% Aqueous solution of propylene oxide-modified polyethyleneimine (manufactured by Nippon Shokubai Co., Ltd.)
Adeka Polyether EDP-450 (manufactured by ADEKA CORPORATION): Ethylenediaminepropylene oxide-modified product
Adeka Polyether BM-34 (manufactured by ADEKA CORPORATION): Ethylenediamineethylene oxide-modified product
PELEX NBL (manufactured by Kao Corporation): Sodium alkyl naphthalene sulfonate

TABLE 5

Developing solution composition examples 8 to 14 (Comparative Examples)

| Components | Developing solution 8 | Developing solution 9 | Developing solution 10 | Developing solution 11 | Developing solution 12 | Developing solution 13 | Developing solution 14 |
|---|---|---|---|---|---|---|---|
| Deionized water | 641.25 | 641.25 | 641.25 | 641.25 | 641.25 | 641.25 | 641.25 |
| Calcium chloride dihydrate | — | 3.75 | 3.75 | 3.75 | — | — | — |
| 40% Aqueous solution of sodium salt of acrylic acid-maleic acid copolymer (molar ratio of 40:60) | 25.0 | — | 25.0 | — | — | 25.0 | — |
| Adeka Polyether EDP-300 | 50.0 | 50.0 | — | — | 50.0 | — | — |
| N,N,N',N'',N''-pentakis(2-hydroxypropyl)diethylenetriamine | — | — | — | — | — | — | — |
| EPOMIN PP-061 | — | — | — | — | — | — | — |
| PELEX NBL | 140.0 | 140.0 | 140.0 | 140.0 | 140.0 | 140.0 | 140.0 |
| Benzyl alcohol | 30.0 | 30.0 | 30.0 | 30.0 | 30.0 | 30.0 | 30.0 |
| 2-(2-Aminoethoxy)ethanol | 75.0 | 75.0 | 75.0 | 75.0 | 75.0 | 75.0 | 75.0 |
| Trisiopropanolamine | 30.0 | 30.0 | 30.0 | 30.0 | 30.0 | 30.0 | 30.0 |
| Succinic acid | 5.0 | 5.0 | 5.0 | 5.0 | 5.0 | 5.0 | 5.0 |

It is shown in Table 6 whether or not these three kinds of components are added in a developing solution for Inventive Example and developing solutions for Comparative Examples.

TABLE 6

| | Developing solutions 1 to 7 Inventive Example | Developing solution 8 Comparative Example | Developing solution 9 Comparative Example | Developing solution 10 Comparative Example | Developing solution 11 Comparative Example | Developing solution 12 Comparative Example | Developing solution 13 Comparative Example | Developing solution 14 Comparative Example |
|---|---|---|---|---|---|---|---|---|
| (C) Metal salt of Group 2 elements | A | NA | A | A | A | NA | NA | NA |
| (D) Polymer comprising carboxyic acid | A | A | NA | A | NA | NA | A | NA |
| (B) Compound represented by the general formula (I) | A | A | A | NA | NA | A | NA | NA |

A: added
NA: not added

In the same manner, developing solutions were prepared as developing solutions 15 to 17 for Comparative Examples in accordance with the composition shown in Table 7. The developing solution 15 was prepared in accordance with the same composition as in the developing solution 1, except that calcium chloride of the developing solution 1 was replaced by sodium chloride. The developing solution 16 was prepared in accordance with the same composition as in the developing solution 1, except that a sodium salt (40% aqueous solution) of an acrylic acid-maleic acid copolymer (molar ratio of 40:60) of the developing solution 1 was replaced by Dextrin ND-S which is a water-soluble resin containing no carboxylic acid. The developing solution 17 was prepared in accordance with the same composition as in the developing solution 1, except that Adeka Polyether EDP-300 of the developing solution 1 was replaced by Adeka Polyether C-300 which is a propylene oxide-modified product of glycerol.

TABLE 7

Developing solution composition examples 15 to 17 (Comparative Examples)

| Components | Developing solution 15 | Developing solution 16 | Developing solution 17 |
|---|---|---|---|
| Deionized water | 641.25 | 641.25 | 641.25 |
| Calcium chloride dihydrate | — | 3.75 | 3.75 |
| Sodium chloride | 3.75 | — | — |
| 40% Aqueous solution of sodium salt of acrylic acid-maleic acid copolymer (molar ratio of 40:60) | 25.0 | — | 25.0 |
| Dextrin ND-S | — | 10.0 | — |
| Adeka Polyether EDP-300 | 50.0 | 50.0 | — |
| Adeka Polyether G-300 | — | — | 50.0 |
| PELEX NBL | 140.0 | 140.0 | 140.0 |

TABLE 7-continued

Developing solution composition examples 15 to 17 (Comparative Examples)

| | | | |
|---|---|---|---|
| Benzyl alcohol | 30.0 | 30.0 | 30.0 |
| 2-(2-Aminoethoxy)ethanol | 75.0 | 75.0 | 75.0 |
| Trisiopropanolamine | 30.0 | 30.0 | 30.0 |
| Succinic acid | 5.0 | 5.0 | 5.0 |

| | Developing solution 15 Comparative Example | Developing solution 16 Comparative Example | Developing solution 17 Comparative Example |
|---|---|---|---|
| (C) Metal salt of Group 2 elements | NA | A | A |
| (D) Polymer comprising carboxyic acid | A | NA | A |
| (B) Compound represented by the general formula (I) | A | A | NA |

Dextrin ND-S (manufactured by NIPPON STARCH CHEMICAL CO., LTD.): Dextrin
Adeka Polyether G-300 (manufactured by ADEKA CORPORATION): Glycerin PO adduct
A: added
NA: not added In order to examine an influence of a molar ratio of metal ions as the component (C) to carboxylic acid as the component (D) exerted on the effects of the present invention, the following test was performed.

In the same manner, except that a molar ratio of metal ions as the component (C) to carboxylic acid as the component (D) was changed, developing solutions were prepared as developing solutions 18 to 19 for Inventive Examples in accordance with the composition shown in Table 8. Although components of the developing solution 18 are the same as those of the developing solution 6, a developing solution composition was prepared so that a molar ratio of metal ions as the component (C) to carboxylic acid as the component (D) becomes 1:1.5. Although components of the developing solution 19 are the same as those of the developing solution 7, a developing solution composition was prepared so that a molar ratio of metal ions as the component (C) to carboxylic acid as the component (D) becomes 1:45.1.

TABLE 8

Developing solution composition examples 18 to 19

| Components | Developing solution 18 | Developing solution 19 |
|---|---|---|
| Deionized water | 641.25 | 641.25 |
| Calcium chloride dihydrate | 3.75 | 3.75 |
| 40% Aqueous solution of sodium salt of acrylic acid-maleic acid copolymer (molar ratio of 40:60) | 8.00 | — |
| 40% Aqueous solution of sodium salt of styrene-acrylic acid copolymer (molar ratio of 70.1:20.9) | — | 333.43 |
| Adeka Polyether EDP-300 | 50.0 | 50.0 |
| N,N,N',N'',N''-pentakis(2-hydroxypropyl) diethylenetriamine EPOMIN PP-061 | — | — |
| Adeka Polyether EDP-450 | — | — |
| Adeka Polyether BM-34 | — | — |
| PELEX NBL | 140.0 | 140.0 |
| Benzyl alcohol | 30.0 | 30.0 |
| 2-(2-Aminoethoxy)ethanol | 75.0 | 75.0 |
| Trisiopropanolamine | 30.0 | 30.0 |
| Succinic acid | 5.0 | 5.0 |
| (C):(D) Carboxylic acid (molar ratio) | 1:1.5 | 1:45.1 |

TABLE 8-continued

Developing solution composition examples 18 to 19

| | Developing solution 18 Inventive Example | Developing solution 19 Inventive Example |
|---|---|---|
| (C) Metal salt of Group 2 elements | A | A |
| (D) Polymer comprising carboxyic acid | A | A |
| (B) Compound represented by the general formula (I) | A | A |

A: added
NA: not added

Formation of Image

Using a plate setter PT-R4300 (manufactured by Dainippon Screen Mfg. Co., Ltd.), the two-layered lithographic printing plate precursor A thus produced was exposed at 150 mJ/cm$^2$. Using an automatic processor P-940X (manufactured by Kodak Japan Ltd.) and a developing solution prepared by diluting the developing solution, obtained in accordance with the composition of Table 4, four times with water, a developing treatment was performed at 30° C. for 15 seconds. Thereafter, gum coating was performed using a finishing gum PF2 (manufactured by Kodak Japan Ltd.). Furthermore, a developing treatment of 2,000 m$^2$ of the lithographic printing plate precursor A was continuously performed while replenishing the developing solution diluted 2.5 times in the amount of 20 ml per 1 m$^2$ treatment of the lithographic printing plate precursor A.

Results

The results are shown in Table 9.

Developability of the non-image area and film loss of the image area of the lithographic printing plate precursor A were observed at the time of 0 m$^2$ treatment, 500 m$^2$ treatment, 1,000 m$^2$ treatment, and 2,000 m$^2$ treatment of the lithographic printing plate precursor A.

With regard to developability of the non-image area, the non-image area was observed by a 25 times magnification loupe and then it was evaluated whether or not the development residue of an image forming layer exists. Evaluation was performed in accordance with the following criteria.

A: Development was sufficiently performed, and the residue of an image recording layer is not observed in the non-image area.

B: The residue of an image recording layer is slightly observed on the non-image area.

C: Development defect is observed on the non-image area and an image recording layer obviously remains.

Using a densitometer (x-rite), the density of a film surface before and after development was measured in terms of an optical density (OD), and then film loss was judged by a remaining ratio (=OD after development/OD before development). Evaluation was performed using the following criteria.

A: Remaining ratio is 95% or more.

B: Remaining ratio is 90% or more and less than 95%.

C: Remaining ratio is less than 90%.

After completion of the developing treatment of 2,000 m$^2$ of a lithographic printing plate precursor A, power was turned off. After being left to stand for 12 hours, a developing solution was drained from a developing solution tank and then it was observed whether or not sludge exists on the bottom of the developing solution tank.

TABLE 9

Results of development test

| Example No. | Developing solution | * (C):(D) | 0 m² treatment Develop-ability | 0 m² treatment Film loss | 500 m² treatment Develop-ability | 500 m² treatment Film loss | 1,000 m² treatment Develop-ability | 1,000 m² treatment Film loss | 2,000 m² treatment Develop-ability | 2,000 m² treatment Film loss | Sludge |
|---|---|---|---|---|---|---|---|---|---|---|---|
| Inventive Example 1 | Developing solution 1 | 1:4.7 | A | A | A | A | A | A | A | A | None |
| Inventive Example 2 | Developing solution 2 | 1:4.7 | A | A | A | A | A | A | A | A | None |
| Inventive Example 3 | Developing solution 3 | 1:4.7 | A | A | A | A | A | A | A | A | None |
| Inventive Example 4 | Developing solution 4 | 1:4.7 | A | A | A | A | A | A | A | A | None |
| Inventive Example 5 | Developing solution 5 | 1:4.7 | A | A | A | A | A | A | A | A | None |
| Inventive Example 6 | Developing solution 6 | 1:2.3 | A | A | A | A | A | A | A | A | None |
| Inventive Example 7 | Developing solution 7 | 1:18.6 | A | A | A | A | A | A | A | A | None |
| Comparative Example 1 | Developing solution 8 | — | A | C | A | C | A | C | A | C | None |
| Comparative Example 2 | Developing solution 9 | — | Undevelopable | | | | | | | | |
| Comparative Example 3 | Developing solution 10 | 1:4.7 | A | A | A | B | B | B | B | C | None |
| Comparative Example 4 | Developing solution 11 | — | Undevelopable | | | | | | | | |
| Comparative Example 5 | Developing solution 12 | — | A | A | A | B | A | C | A | C | None |
| Comparative Example 6 | Developing solution 13 | — | A | C | A | C | A | C | A | C | None |
| Comparative Example 7 | Developing solution 14 | — | A | A | A | C | B | C | B | C | None |
| Comparative Example 8 | Developing solution 15 | — | A | C | A | C | A | C | A | C | None |
| Comparative Example 9 | Developing solution 16 | — | Undevelopable | | | | | | | | |
| Comparative Example 10 | Developing solution 17 | 1:4.7 | A | A | A | B | B | B | B | C | None |
| Inventive Example 8 | Developing solution 18 | 1:1.5 | B | A | B | A | B | A | B | A | None |
| Inventive Example 9 | Developing solution 19 | 1:45.5 | A | B | A | B | A | C | A | C | None |

*(C):(D) indicates a molar ratio of (C) metal ions to (D) carboxylic acid

Inventive Examples 1 to 7 in which a developing treatment of a lithographic printing plate precursor A was performed using developing solutions 1 to 7 each containing, as developing solution components, (C) elements belonging to Group 2 of the Periodic Table of the Elements, (B) a compound represented by the general formula (I), and (D) a polymer comprising carboxylic acid, a molar ratio of (C) metal ions to (D) carboxylic acid being within a range from 1:2 to 1:40, even if a treatment area increased, the non-image area was sufficiently developed, and also image area maintained a state of remaining ratio of 95% or more. After completion of a 2,000 m² treatment, sludge did not accumulate on the bottom of a developing solution tank and thus it was easy to wash the developing solution tank.

In the developing solution 8, (B) a compound represented by the general formula (I) and (D) a polymer comprising carboxylic acid were added, while (C) elements belonging to Group 2 of the Periodic Table of the Elements were not added. In the case of this developing solution, the developing solution penetrated into the image area and film loss of the image area became larger when the developing solution in a developing solution tank was fresh, right after 0 m² treatment (Comparative Example 1).

In the developing solution 9, (C) a metal salt of elements belonging to Group 2 of the Periodic Table of the Elements and (B) a compound represented by the general formula (I) were added, while (D) a polymer comprising carboxylic acid was not added. In the case of this developing solution, it was impossible to develop when the developing solution in a developing solution tank was fresh, right after 0 m² treatment (Comparative Example 2).

In the developing solution 10, (C) a metal salt of elements belonging to Group 2 of the Periodic Table of the Elements and (D) a polymer comprising carboxylic acid were added, while (B) a compound represented by the general formula (I) was not added. In the case of this developing solution, the non-image area was developed and the image area was in a satisfactory state with less film loss when the developing solution was fresh, right after 0 m² treatment. After a 500 m² treatment, film loss increased and, after a 1,000 m² treatment, the development residue became possible to be observed in the non-image area (Comparative Example 3).

In the developing solution 11, (C) a metal salt of elements belonging to Group 2 of the Periodic Table of the Elements was added, while (B) a compound represented by the general formula (I) and (D) a polymer comprising carboxylic acid were not added. In the case of this developing solution, it was impossible to develop when the developing solution in a developing solution tank was fresh, right after 0 m² treatment (Comparative Example 4).

In the developing solution 12, (B) a compound represented by the general formula (I) was added, while (C) a metal salt of elements belonging to Group 2 of the Periodic Table of the Elements and (D) a polymer comprising carboxylic acid were not added. In the case of this developing solution, the non-image area was developed and film loss was observed when the developing solution was fresh, right after 0 m² treatment. After a 1,000 m² treatment, film loss further increased (Comparative Example 5).

In the developing solution 13, (D) a polymer comprising carboxylic acid was added, while (C) a metal salt of elements belonging to Group 2 of the Periodic Table of the Elements and (B) a compound represented by the general formula (I) were not added. In the case of this developing solution, the developing solution penetrated into the image area immediately after charging the developing solution in a developing solution tank (0 m² treatment), thus increasing film thinning of the image area (Comparative Example 6).

In the developing solution 14, any of (D) a polymer comprising carboxylic acid, (B) a compound represented by the general formula (I), (C) a metal salt of elements belonging to Group 2 of the Periodic Table of the Elements was not added. In the case of this developing solution, the non-image area was developed and the image area was in a satisfactory state with less film loss when the developing solution was fresh, right after 0 m² treatment. After a 500 m² treatment, film loss increased and, after a 1,000 m² treatment, the development residue became possible to be observed in the non-image area, in addition to film loss increase (Comparative Example 7).

In the developing solution 15, (D) a polymer comprising carboxylic acid and (B) a compound represented by the general formula (I) were added, and sodium chloride was added as a metal salt of elements belonging to Group 1 in place of (C) a metal salt of elements belonging to Group 2 of the Periodic Table of the Elements. In the case of this developing solution, the developing solution penetrated into the image area and film loss of the image area became larger when the developing solution in a developing solution tank was fresh, right after 0 m² treatment (Comparative Example 8)

In the developing solution 16, (B) a compound represented by the general formula (I) and (C) a metal salt of elements belonging to Group 2 of the Periodic Table of the Elements were added, and dextrin which is a water-soluble resin was added in place of (D) a polymer comprising carboxylic acid. In the case of this developing solution, it was impossible to develop when the developing solution in a developing solution tank was fresh, right after 0 m² treatment (Comparative Example 9).

In the developing solution 17, (C) a metal salt of elements belonging to Group 2 of the Periodic Table of the Elements and (D) a polymer comprising carboxylic acid were added, and an glycerol polyoxyethylene adduct was added in place of (B) a compound represented by the general formula (I). In the case of this developing solution, the non-image area was developed and the image area was in a satisfactory state with less film loss when the developing solution was fresh, right after 0 m² treatment. After a 500 m² treatment, film loss increased and, after a 1,000 m² treatment, the development residue became possible to be observed in the non-image area, in addition to film loss increase (Comparative Example 10).

The developing solution 18 is an example in which a molar ratio of metal ions as the component (C) to a carboxylic acid group as the component (D) of the developing solution 6 (Inventive Example 6) was changed. All of (B) a compound represented by the general formula (I), (C) a metal salt of elements belonging to Group 2 of the Periodic Table of the Elements, and (D) a polymer having a carboxylic acid were added, and the molar ratio of metal ions as the component (C) to a carboxylic acid group as the component (D) was 1:1.5. In the case of this developing solution, the development residue became possible to be observed in the non-image area when the developing solution was fresh right after 0 m² treatment, and film loss was satisfactory up to 2,000 m² treatment (Inventive Example 8).

The developing solution 19 is an example in which a molar ratio of metal ions as the component (C) to carboxylic acid as the component (D) of the developing solution 7 (Inventive Example 7) was changed. All of (B) a compound represented by the general formula (I), (C) a metal salt of elements belonging to Group 2 of the Periodic Table of the Elements, and (D) a polymer having a carboxylic acid group were added, and the molar ratio of metal ions as the component (C) to a carboxylic acid group as the component (D) was 1:45.1. In the case of this developing solution, the non-image area was satisfactory developed up to 2,000 m² treatment, while film loss was slightly observed in the image area when the developing solution was fresh right after 0 m² treatment (Inventive Example 9).

The invention claimed is:

1. A method for producing a lithographic printing plate, comprising the steps of:
    imagewise exposing a positive working lithographic printing plate precursor comprising, a substrate having a hydrophilic surface having thereon, a lower layer comprising a resin which is water-insoluble and alkali-soluble and an upper layer comprising a resin which is water-insoluble and alkali-soluble formed on the lower layer, at least one of the lower layer and the upper layer comprising a photothermal conversion material, using an infrared laser to provide exposed areas in the resulting exposed positive working lithographic printing plate precursor; and
    developing the exposed positive working lithographic printing plate precursor with an alkali developing solution composition to remove the exposed areas, and to form an image area and a non-image area,
    wherein the alkali developing solution composition comprises:
    (A) an alkali agent,
    (B) a compound represented by formula (I) shown below,
    (C) a metal salt of Group 2 elements of the Periodic Table of the Elements, and
    (D) a polymer comprising carboxylic acid or a salt thereof:

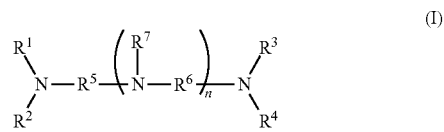

(I)

wherein $R^1$ to $R^4$ each independently represents H or $-(AO)_a(BO)_b R^9$, AO and BO are selected from an ethyleneoxy group and a propyleneoxy group, wherein a and b represent an integer of from 0 to 300, but $(a+b) \neq 0$, $R^9$ represents H, $CH_3$, $COR^{10}$, or $CONHR^{11}$, and $R^{10}$ and $R^{11}$ represent an alkyl group, an aryl group, an alkenyl group, or an alkynyl group; $R^5$ and $R^6$ each independently represents a divalent linking group and may be the same or different;
$R^7$ can be selected from groups defined in aforementioned $R^1$ to $R^4$, or can be selected from the substituent group represented by the following formula (II):

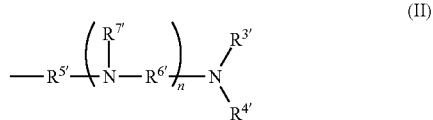 (II)

wherein $R^{3'}$ is the same as $R^3$ defined in the formula (I),
$R^{4'}$ is the same as $R^4$ defined in the formula (I),
$R^{5'}$ is the same as $R^5$ defined in the formula (I),
$R^{6'}$ is the same as $R^6$ defined in the formula (I), and
$R^{7'}$ is the same as $R^7$ defined in the formula (I); and
n in the formulae (I) and (II) represents an integer of 0 to 20 and, when n is 2 or more, $R^7$ and $R^{7'}$ each can be independently selected.

2. The method according to claim 1, wherein Group 2 elements of the Periodic Table of the Elements (C) are selected from the group consisting of magnesium, calcium, strontium, and barium.

3. The method according to claim 1, wherein (C) the metal salt of Group 2 elements is selected from the group consisting of a chloride, a carbonate, an acetate, a sulfate, a nitrate, and a phosphate.

4. The method according to claim 1, wherein (D) the polymer comprising carboxylic acid or a salt thereof is a polymer or copolymer comprising a structural unit represented by the general formula (III):

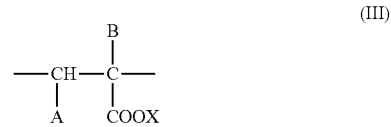 (III)

wherein B represents a hydrogen atom, an alkyl group having 1 to 3 carbon atoms, or an —$R^a$—COOX group, wherein $R^a$ represents an alkylene group which may have a substituent, A represents a hydrogen atom, a carbamoyl group, an alkoxycarbonyl group, a carboxyl group, or a salt thereof, and X represents a hydrogen atom, an alkali metal atom, a protonated organic amine group, or a quaternary ammonium group.

5. The method according to claim 1, wherein (A) the alkali agent comprises organic amines.

6. The method according to claim 1, wherein the alkali developing solution further comprises an organic solvent.

7. The method according to claim 1, wherein the alkali developing solution further comprises a surfactant.

8. The method according to claim 1, wherein the alkali developing solution composition has a pH of 12 or lower.

9. The method according to claim 1, wherein the alkali developing solution composition has a pH of 11 or lower.

* * * * *